United States Patent
Chen et al.

(10) Patent No.: US 11,068,161 B1
(45) Date of Patent: Jul. 20, 2021

(54) MEMORY MODULE WITH EMULATED MEMORY DEVICE POPULATION

(71) Applicant: Rambus Inc., Sunnyvale, CA (US)

(72) Inventors: Catherine Chen, Cupertino, CA (US); Thomas J. Giovannini, San Jose, CA (US); John Eric Linstadt, Palo Alto, CA (US)

(73) Assignee: Rambus Inc., San Jose, CA (US)

( * ) Notice: Subject to any disclaimer, the term of this patent is extended or adjusted under 35 U.S.C. 154(b) by 98 days.

(21) Appl. No.: 15/645,596

(22) Filed: Jul. 10, 2017

Related U.S. Application Data

(60) Provisional application No. 62/363,764, filed on Jul. 18, 2016.

(51) Int. Cl.
| | |
|---|---|
| *G11C 8/12* | (2006.01) |
| *G11C 5/06* | (2006.01) |
| *G06F 3/06* | (2006.01) |
| *G06F 13/10* | (2006.01) |
| *G06F 13/40* | (2006.01) |

(52) U.S. Cl.
CPC ............ *G06F 3/0604* (2013.01); *G06F 3/068* (2013.01); *G06F 3/0659* (2013.01); *G06F 13/105* (2013.01); *G06F 13/4022* (2013.01); *G11C 5/066* (2013.01); *G11C 8/12* (2013.01)

(58) Field of Classification Search
CPC .................................. G11C 5/066; G11C 8/12
See application file for complete search history.

(56) References Cited

U.S. PATENT DOCUMENTS

| | | | |
|---|---|---|---|
| 6,697,828 B1 | 2/2004 | Ott | |
| 7,383,416 B2 | 6/2008 | Oeschay et al. | |
| 7,432,731 B2 | 10/2008 | Bains et al. | |
| 7,539,812 B2 | 5/2009 | Tetrick | |
| 7,694,093 B2 | 4/2010 | Shaw et al. | |
| 8,264,903 B1 | 9/2012 | Lee et al. | |
| 8,407,394 B2 | 3/2013 | Mazzola et al. | |
| 8,539,145 B1 * | 9/2013 | Warnes | G06F 13/1684 711/105 |
| 8,599,634 B1 | 12/2013 | Lee et al. | |
| 8,773,937 B2 * | 7/2014 | Schakel | G11C 11/406 365/194 |
| 8,825,965 B2 | 9/2014 | Mazzola et al. | |
| 9,837,132 B2 * | 12/2017 | Ware | G11C 5/04 |

(Continued)

OTHER PUBLICATIONS

Choi. "Next Big Thing : DDR4 3DS." 2014. https://www.jedec.org/sites/default/files/files/JS_Choi_Server_Forum_2014(1).pdf. (Year: 2014).*

*Primary Examiner* — Nathan Sadler
(74) *Attorney, Agent, or Firm* — Charles Shemwell

(57) ABSTRACT

In a memory module having a plurality of discrete memory die packages, an N-bit data interface and a command/address buffer, a memory access command and chip-select input signals are received within the command/address buffer. In response to the chip-select input signals, the command/address buffer outputs chip-select output signals greater in quantity than the chip-select input signals to exclusively enable one of a plurality of groups of the discrete memory die packages to respond to the memory access command, each of the plurality of groups of the discrete memory die packages having a collective data interface width less than the N-bit data interface width.

21 Claims, 7 Drawing Sheets

(56) References Cited

U.S. PATENT DOCUMENTS

| | | | |
|---|---|---|---|
| 9,916,873 B2* | 3/2018 | Giovannini | G11C 5/04 |
| 2006/0039205 A1* | 2/2006 | Cornelius | G06F 13/1673 |
| | | | 365/189.05 |
| 2006/0062047 A1* | 3/2006 | Bhakta | G06F 12/0207 |
| | | | 365/185.09 |
| 2006/0117152 A1* | 6/2006 | Amidi | G11C 5/04 |
| | | | 711/154 |
| 2006/0233012 A1* | 10/2006 | Sekiguchi | G11C 5/02 |
| | | | 365/51 |
| 2006/0262586 A1* | 11/2006 | Solomon | G06F 12/0207 |
| | | | 365/63 |
| 2007/0007992 A1 | 1/2007 | Bains et al. | |
| 2008/0080261 A1* | 4/2008 | Shaeffer | G11C 7/222 |
| | | | 365/189.05 |
| 2009/0024903 A1 | 1/2009 | Bueb | |
| 2010/0030942 A1* | 2/2010 | Hinkle | G06F 12/06 |
| | | | 711/5 |
| 2013/0104000 A1 | 4/2013 | Bueb | |
| 2015/0103479 A1* | 4/2015 | Ware | G11C 11/4093 |
| | | | 361/679.31 |
| 2016/0028395 A1 | 1/2016 | Bains et al. | |
| 2016/0055899 A1 | 2/2016 | Bains | |
| 2016/0314085 A1* | 10/2016 | Ware | G06F 13/00 |
| 2017/0337144 A1* | 11/2017 | Ware | G06F 13/1678 |

* cited by examiner

| Emulated Module Type | Host Perspective/RCD Inputs | | | | Memory-Side RCD Perspective/Outputs | | | |
|---|---|---|---|---|---|---|---|---|
| | Mem Pkg Type | CS Inputs | Layer-ID Input Bits | Logical Ranks | Mem Pkg Type | CS Outputs | Layer-ID Output Bits | Demi-Ranks |
| 2-Dual Die/2-Rank (2D2R) | dual-die pkg (DDP) | 4 | 0 | 4 | single-die pkg (SDP) | 4 | 0 | 4 |
| 2-Stack/2-Rank (2S2R) | 3DS-2 | 2 | 1 | 4 | SDP | 4 | 0 | 4 |
| 2-Stack/4-Rank (2S4R) | 3DS-4 | 2 | 2 | 8 | DDP | 8 | 0 | 8 |
| 2-Stack/4-Rank (2S4R) | 3DS-4 | 2 | 2 | 8 | 3DS-2 | 4 | 1 | 8 |
| 1-Stack/8-Rank (1S8R) | 3DS-8 | 1 | 3 | 8 | 3DS-4 | 2 | 2 | 8 |
| 2-Stack/8-Rank (2S8R) | 3DS-8 | 2 | 3 | 16 | 3DS-4 | 4 | 2 | 16 |

FIG. 6

RCD — Emulation Control Field (ECF) 363 — Mode Reg

365

| ECF[3:0] | | Reported LRDIMM Config | Definition |
|---|---|---|---|
| EE | EmSelect | | |
| 0 | X X X X | Native | Emulation Disabled |
| 1 | 0 0 0 0 | 2S8R/3DS-4 | Emulate 2S8R with physical 3DS-4 |
| 1 | 0 0 0 1 | 1S8R/3DS-4 | Emulate 1S8R with physical 3DS-4 |
| 1 | 0 0 1 0 | 2S4R/3DS-2 | Emulate 2S4R with physical 3DS-2 |
| 1 | 0 0 1 1 | 2S4R/DDP | Emulate 2S4R with physical DDP |
| 1 | 0 1 0 0 | 1S4R/3DS-2 | Emulate 1S4R with physical 3DS-2 |
| 1 | 0 1 0 1 | 1S4R/DDP | Emulate 1S4R with physical DDP |
| 1 | 1 1 1 0 | 2S2R/SDP | Emulate 2S2R, 3DS-2 with physical SDP |
| 1 | 1 1 1 1 | 1S2R/SDP | Emulate 1S2R, 3DS-2 with physical SDP |

FIG. 7

Module reports virtual hardware set to host in response to SPD query

381 → single-rank cmd? 383
- yes → RCD converts rank-select inputs into demi-rank selection signals and outputs demi-rank data-mux control to DBs — 385 all-rank cmd? 387
- yes → RCD drives rank-select outputs and memory-side CA signals as necessary to broadcast command and/or operand(s) — 389

FIG. 8

Module reports native/emulation mode option(s) to host in response to SPD query — 393

RCD stores native/emulation mode selection in response to mode-set command from host — 395

RCD drives rank-select outputs and data-mux control outputs in accordance with selected operating mode — 397

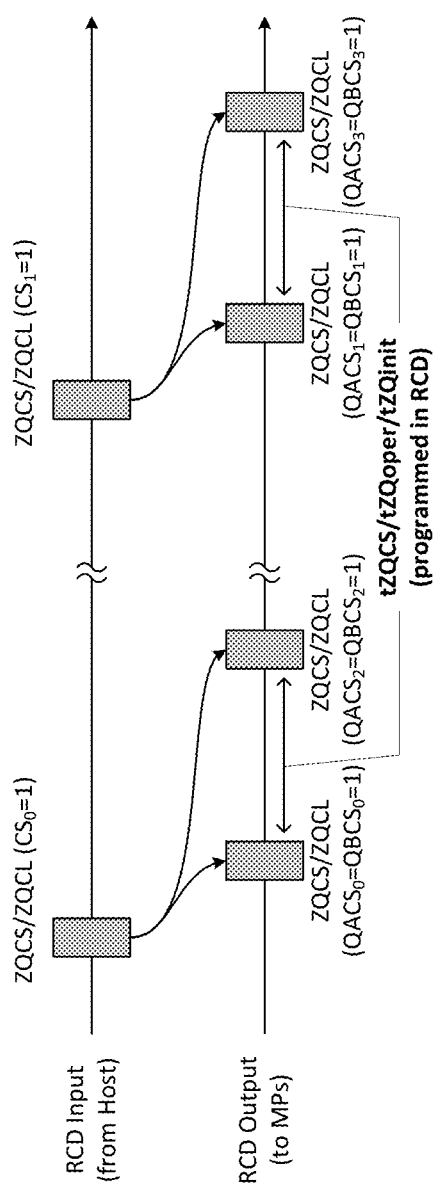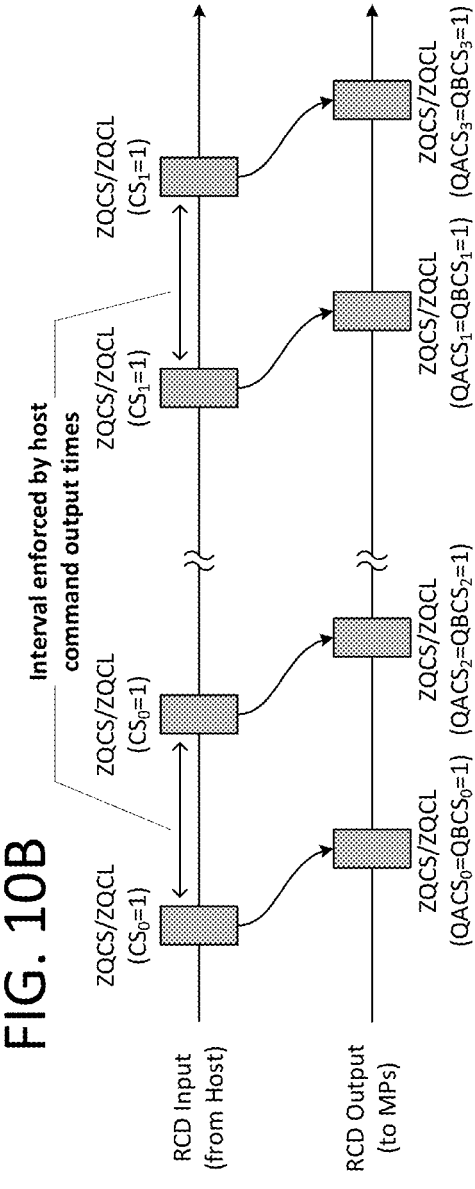
FIG. 10A
FIG. 10B

MEMORY MODULE WITH EMULATED MEMORY DEVICE POPULATION

TECHNICAL FIELD

The present disclosure relates to modular memory systems.

DRAWINGS

The various embodiments disclosed herein are illustrated by way of example, and not by way of limitation, in the figures of the accompanying drawings and in which like reference numerals refer to similar elements and in which:

FIG. 1 illustrates alternative memory systems populated by an emulation-mode memory module pair configured respectively for native mode operation and emulation-mode operation;

FIG. 2 contrasts an emulated 4-logical-rank LRDIMM (load-reduced dual-inline memory module) as perceived by a host controller with an underlying physical pair of LRDIMMs having two logical ranks each;

FIG. 5 illustrates a non-exhaustive tabulation of emulated memory module types together with perspectives of same by the host and underlying physical implementations;

FIG. 6 illustrates an exemplary production-time-programmable and/or run-time-programmable mode register that may be included within the registered clock driver (RCD) component of an emulation-mode memory module;

FIGS. 7 and 8 illustrate alternative initializations of memory systems that incorporate emulation-mode memory modules;

FIGS. 10A and 10B illustrate alternative approaches for carrying out emulation-mode operations that apply to an entire device layer of a physical package rank and require time-multiplexed access to/use of a shared resource.

DETAILED DESCRIPTION

Memory modules that enable module-distributed memory rank access at least in part by reporting emulated memory device populations to a host controller are disclosed in various embodiments. In a number of implementations, memory modules are configurable in either a native mode in which any of N logical memory ranks may be enabled to concurrently output/receive data over the full width of the module data interface, or an emulation mode in which any of 2N half-ranks ("demi-ranks") may be enabled to output/receive data over a host-coupled half of the module data interface. In systems where the host controller data interface and chip-to-chip data path matches the full width of the module data interface, demi-ranks within two (paired) emulation-mode memory modules may concurrently output/receive data over respective halves of the data path and thus operate, from the controller or host perspective, as a single logical memory rank—referred to herein as a "module-distributed" logical memory rank. That is, a pair of emulation-mode memory modules may collectively emulate a single memory module populated by the emulated memory device type and thus a memory module having twice the storage capacity and logical memory rank count of either underlying physical (actual) memory module. Also, because each half of the memory path is coupled exclusively to a respective module of a given emulation-mode module pair in a point-to-point interconnect topology, controller-to-module signaling rates may be substantially higher than in a conventional multi-drop memory system populated by native-mode configurations of those same two modules—that is, same memory capacity with higher signaling bandwidth.

Figure 1:
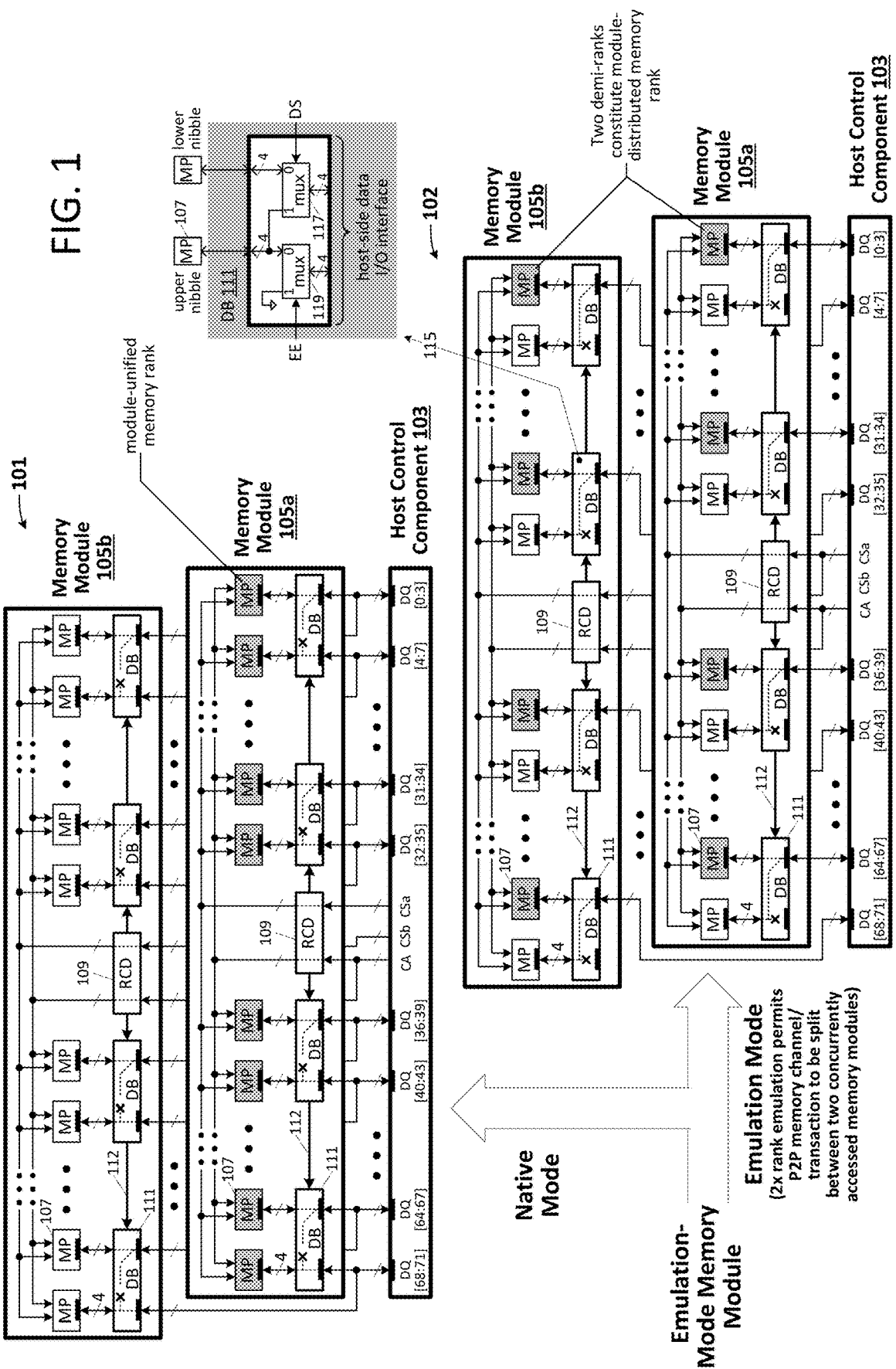

FIG. 1 illustrates alternative memory systems 101 and 102 populated by an emulation-mode memory module pair 105a/105b configured respectively for native-mode operation (system 101) and emulation-mode operation (system 102). A host controller component 103 (e.g., dedicated memory controller, central processing unit (CPU) or any other component having a memory control function, also referred to herein as the "host" or "host controller") has generally the same operational signaling outputs in either configuration so that, except for increased capacity and/or signaling performance afforded by the emulation-mode system configuration 102 and possible initialization/maintenance differences, the different signal routing and memory-module configurations are transparent (i.e., not visible) to the host. More specifically, in both systems, host controller 103 outputs command/address values (commands and addresses) to the memory module population over a command/address path ("CA") and receives read data or outputs write data over a 72-bit data path, composed in the depicted example by 18 4-bit (nibble-sized) sets of data links ("DQ"). The control component additionally outputs chip-select signals, "CS" (and, optionally, one or more chip-ID or layer-ID signals as discussed below), to select one of multiple logical memory ranks in connection with a commanded memory/access operation, each such logical memory rank or "logical rank" being a respective set of memory dies having a collective data interface width that matches the host data interface width and selectable (i.e., via chip-select and/or chip-ID signals) to concurrently receive or output data associated with a command conveyed on the CA path. Though not specifically shown, host controller 103 may also output various timing signals (clock signals and/or strobe signals) to time reception of command/address signals and data signals within memory modules 105a/105b and one or more selected logical ranks thereof. In one embodiment, for example, host controller 103 forwards a differential clock signal to memory modules 105a/105b to time reception of command/address signals therein (and establish a primary internal clock domain within various memory devices and other integrated-circuit components on each memory module) and also outputs or receives data strobe signals over differential data strobe links (DQS) associated with respective subsets of data path links (DQ). Host controller 103 may also output additional control signals to control on-die termination (ODT), enable or disable clock reception and so forth within one or more logical memory ranks.

Still referring to FIG. 1, command/address and control signal routing is largely identical between the native-mode and emulation-mode system configurations (101, 102), except that chip-select signal sets CSa and CSb coupled to respective memory modules 105a and 105b (i.e., dedicated to respective memory modules) in native-mode configuration 101 are re-routed in emulation-mode configuration 102 with signal set CSa being coupled in parallel to both memory modules 105*a* and 105*b* (and signal set CSb optionally being used to control another pair of emulation-mode memory modules), thus enabling both memory modules 105*a* and 105*b* in system 102 to respond to commands targeting a given logical rank or collection of logical ranks. In contrast to the relatively minor change in command/address/control signal routing, the native-mode and emulation-mode data path topologies are fundamentally different, with the host controller data interface being coupled in parallel to each of the memory modules in native-mode system 101 (i.e., establishing a multi-drop configuration in which each individual data link is coupled to both memory modules via respective stub-paths) and, by contrast, with each half of the host controller data interface being coupled point-to-point to a respective one of memory modules 105*a* and 105*b* in emulation-mode system 102.

For purposes of understanding emulation-mode operations, it is helpful to distinguish between a logical rank (a die-level construct as discussed above) and a "package rank" which refers herein to a set of discrete memory packages containing one or more logical ranks according to the per-package memory die count (memory packages having multiple chip-select inputs are deemed for purposes of determining package rank count to constitute multiple discrete memory packages according to the number of chip-select inputs). Qualifiers "native-mode" and "emulation-mode" are used to distinguish between module-unified package ranks/logical ranks (native-mode) and module-distributed package ranks/logical ranks (emulation-mode). Thus, a memory module having or perceived as having M rows (or other organizations) of N discrete memory packages in which each such memory package has K logical dies and a data interface width that is a 1/Nth fraction of the host data interface width is referred to herein as having M package ranks and M*K logical ranks. As a specific example, a dual inline memory module (DIMM) coupled to a ×72 host data interface and having two rows of 18 discrete ×4 memory packages (i.e., each of 18 discrete memory packages having a 4-bit data interface width) disposed on respective "front" and "back" faces of the memory module (each to be coupled directly or indirectly to a respective 4-bit nibble of the host data interface) is said to have two package ranks. If each memory package contains a single memory die (i.e., a "single-die package" or "SDP"), then the logical rank count matches the package rank count at two. If each memory package is a three-dimensional stacked package having two, four, eight, etc. die layers (3DS-2, 3DS-4, 3DS-8, etc.), then the logical rank count is a corresponding multiple of the package rank count, totaling to four (2*2) for 3DS-2 memory packages, eight (2*4) for 3DS-4 memory packages, sixteen (2*8) for 3DS-8 memory packages, and so forth. A DIMM coupled to a ×72 host data interface and having two rows of 18 discrete ×4 dual-die packages (i.e., a discrete memory package having two chip-select inputs each coupled to a respective one of two ×4 memory dies) disposed on respective faces of the memory module is said to have four package ranks (two package ranks on each face of the DIMM) and four logical ranks. As discussed in greater detail below, each logical rank may be split into the aforementioned demi-ranks (each including a respective memory die from half the memory packages in a native-mode package rank) or even smaller sub-rank memory die collections for emulation-mode operation.

Returning to the embodiment of FIG. 1, each of memory modules 105*a* and 105*b* is implemented by a load-reduced DIMM having front-side and back-side memory packages 107, "MP" (only front-side MPs are depicted), a registered clock driver component 109 (RCD), and a number of data buffer components 111 (DBs). As shown, RCD 109 is coupled to receive various control signals from host controller 103 (e.g., command/address signals and chip-select signals as depicted, as well as various other control signals not shown such as the aforementioned clock and clock-enable signals, ODT signals, chip-ID signals in accordance with memory-package type, etc.) via a host-side interface and outputs corresponding control signals to memory packages 107 via a memory-side interface in accordance with an emulation-mode/native-mode configuration register setting. RCD 109 additionally outputs control signals to the data buffers via a buffer-command ("BCOM") bus 112 to enable native-mode and emulation-mode operations therein.

In the embodiment of FIG. 1, each of data buffers 111 includes dual or paired 4-bit (or nibble) host-side data interfaces and corresponding paired 4-bit memory-side data interfaces with the latter coupled in 4-bit nibbles to respective ×4 memory packages 107—that is, each DB 111 buffers the data and data-timing paths (DQS, not shown) for a respective set of memory packages 107 to effect, from the host perspective, a single data path load per memory module, regardless of the number of memory packages coupled to the memory-side data interface. In one embodiment, for example, a single set of data buffers 111 is disposed on a single side of the DIMM with each data buffer 111 coupled to a respective set of four memory packages 107—a front-side pair and a backside pair. Accordingly, each nibble (upper and lower) of the memory-side data interface is coupled in parallel to a front-side memory package 107 and a back-side memory package 107 with multiplexing logic provided within data buffer 111 to select between those packages according to the package rank selected to participate in a given memory access operation or other memory-related transaction. In alternative embodiments the dual ×4 host-side and memory-side data interfaces may be narrower (e.g., ×2 or ×1) or wider (×8, 16, etc.) to interconnect memory packages having correspondingly narrower or wider data interfaces.

Referring to detail view 115 of FIG. 1, each data buffer 111 additionally includes a demi-rank multiplexer 117 that, during emulation-mode operation, enables dynamic selection between respective halves of a given native-mode package rank. More specifically, during an emulation-mode memory access, RCD 109 outputs a demi-rank select signal "DS" to data buffer 111 (or a command that indicates a demi-rank selection) to select via multiplexer 117 either a "lower" or "upper" half of the native-mode package rank (also referred to herein as "lower nibble" and "upper nibble") which, in accordance with demi-rank selection signals supplied to memory packages via the RCD's memory-side control interface enables either a lower or upper demi-rank (half a logical memory rank) to transmit/receive data via the half data channel coupled to a given emulation-mode memory module. By this arrangement, and by the concurrent demi-rank selection within each of the two emulation-mode memory modules, the two selected demi-ranks form a logical memory rank that is distributed across the emulation-mode module pair, thus emulating a logical rank selection within a single memory module populated by the emulated memory package type.

Still referring to detail view 115, an emulation-enable signal ("EE") may be used to selectively disable (e.g., couple to ground or other steady-state voltage) half of the data-buffer input/output (I/O). In the particular embodiment shown, for example, when the emulation-enable signal is asserted (emulation mode operation enabled), multiplexer 119 decouples the upper-nibble data buffer I/O from the upper-nibble memory package (leftmost memory package in exemplary view 115) and instead couples the upper-nibble I/O to ground. Note that the enable-emulation signal may also be used to gate the demi-rank select input to multiplexer 117 so that, when emulation mode is disabled (emulation enable signal low) multiplexer 117 exclusively couples the lower-nibble data buffer I/O to the data interface of the lower-nibble memory package. In native mode, multiplexers 117 and 119 provide though-paths to their respective memory-side ports (i.e., multiplexer 117 provides a through-path to the lower-nibble memory components and multiplexer 119 provides a through-path to the upper-nibble memory components). More generally, data buffer 111 may provide both through-paths and cross-coupled paths between the controller-side and memory-side data ports.

Figure 2:
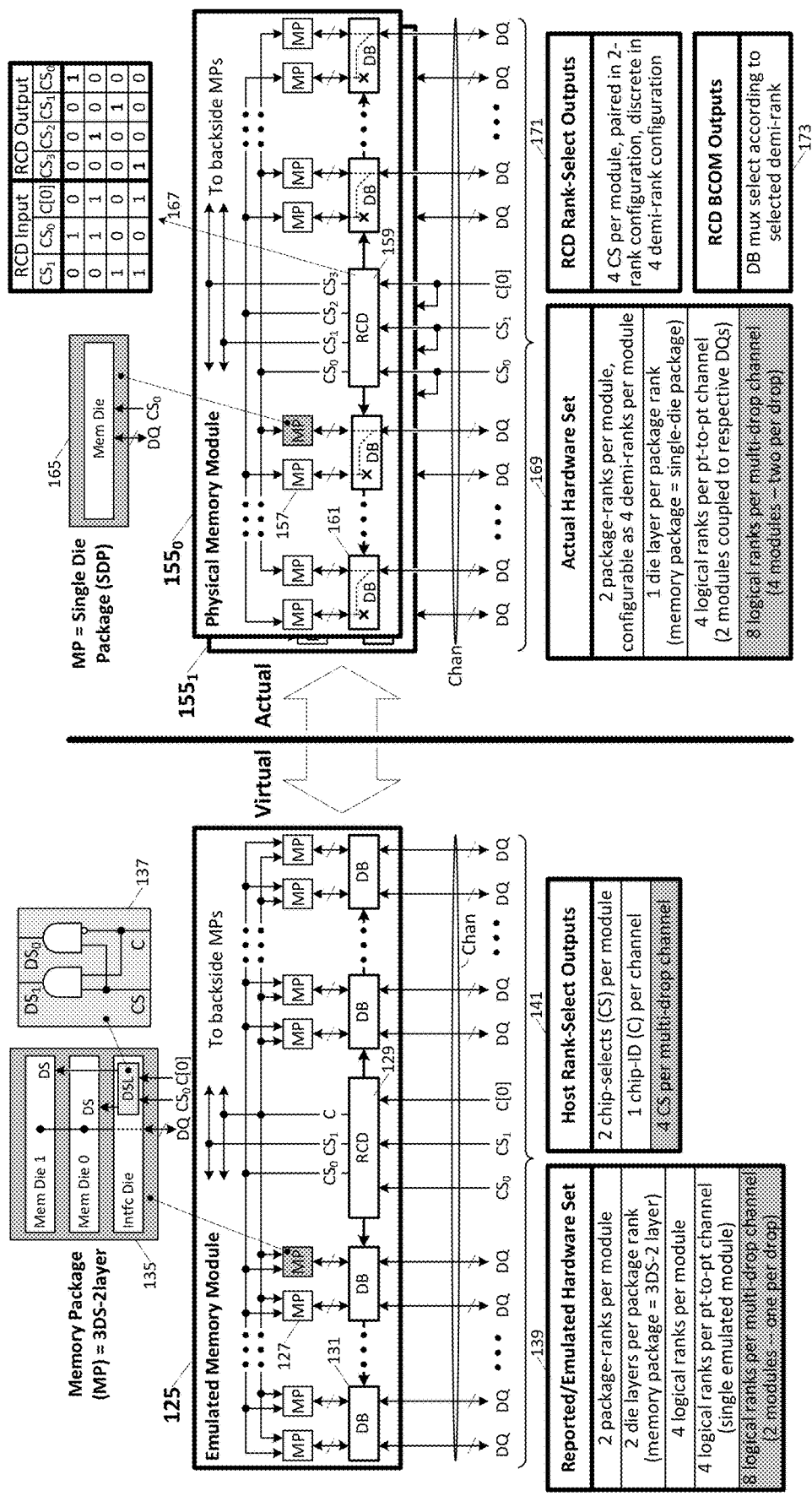

FIG. 2 contrasts an emulated 4-logical-rank memory module 125 as perceived by a host controller (left-side or "virtual" view of figure) with an underlying physical pair of memory modules $155_0/155_1$ having two native-mode logical ranks per physical memory module (right-side or "actual" view of figure). Referring first to the virtual (emulated) view, the host perceives the two underlying physical memory modules $155_0$ and $155_1$ as a single load-reduced DIMM 125 populated by 3DS-2 memory packages 127 and having RCD 129 and data buffers 131. Thus, as shown in table 139, the emulated hardware set includes two package-ranks per module (one each on the front-side and backside of the module substrate) and two die layers per package rank, thus effecting four logical ranks per emulated memory module 125. Accordingly, the host perceives four logical memory ranks in a system populated by a single point-to-point-coupled emulated module 125 (i.e., two underlying physical memory modules $155_0/155_1$ coupled point-to-point to the host via respective halves of the data path) and eight logical memory ranks in a system populated by two multi-drop-coupled emulated modules 125 (i.e., two pairs of physical memory modules $155_0/155_1$ with each pair implementing a respective emulated module 125).

Still referring to FIG. 2, the host outputs chip-select and chip-ID signals (collectively referred to herein as "rank-select" signals) to RCD 129 within emulated memory module 125 in accordance with the emulated module type and thus two fully decoded chip-select signals ($CS_0$ and $CS_1$) per emulated module to select between emulated front-side and back-side package ranks, and one encoded chip-ID signal (C[0]) to select between memory die layers within the emulated 3DS-2 memory package 127. Each emulated 3DS-2 memory package 127 models, for example, a commodity physical package having an interface die (or "base layer" die) and two memory dies. As shown in conceptual view 135, the interface die ("Intfc Die") includes a data interface (e.g., 4-bit interface, though larger or smaller interface widths may be implemented) coupled to corresponding data interfaces within the two memory dies ("Mem Die 0" and "Mem Die 1"), and a die-select logic circuit ("DSL") that enables selection of one of the two memory dies, as part of logical memory rank, according to states of the host-supplied chip-select and chip ID signals (e.g., asserting one of die select signals DS0, DS1 to select a corresponding one of the two memory dies in accordance with the decoding logic shown conceptually at 137). In alternative embodiments, the die-select logic may be implemented on each memory die and selectively enabled by the interface die/base-layer die according to the logical rank targeted in a given memory transaction. Also, as with all memory packages in the various embodiments presented herein, constituent memory dies may be dynamic random access memory (DRAM) dies, static random access memory (SRAM) dies, or various types of non-volatile memory dies (e.g., NAND and/or NOR Flash memory, phase-change memory, magneto-resistive memory, etc.).

Continuing with the FIG. 2 emulation example, physical memory modules $155_0$ and $155_1$ are single-die-package (SDP) DIMMs and thus each populated by half the number of memory dies perceived by the host to be present on emulated memory module 125. As shown, memory modules $155_0$ and $155_1$ are coupled to respective halves of the host data interface as discussed above, and are coupled in parallel to the control signal path, of which only the rank-select signals are shown (i.e., CA, clock, clock-enable, ODT, etc. not shown). In contrast to the emulation-module RCD 129 which, at least conceptually, outputs memory-side rank-select signals that match those supplied by the host (i.e., in some cases duplicating one or more signals to limit signal fan-out), the physical memory-module RCD components 159 translate (or convert) the host-supplied rank-select signals from the emulation rank-select set to physical demi-rank selection signals—that is, from $CS_0$, $CS_1$ and C[0] to four discrete demi-rank selection signals $CS_0$-$CS_3$ in accordance with the table shown at 167 to select a respective one of four demi-ranks. Each of the physical-module RCDs 159 additionally outputs demi-rank select signals to demi-rank multiplexers within data buffers 161 (e.g., via the BCOM bus per table 173) to couple the constituent memory packages 157 of the selected demi-rank to the operational half of the data buffers' host-side data interfaces (and thus to the half of the module data interface coupled to the host controller). Thus, as shown in table 169, each physical (actual) memory module $155_0$ or $155_1$ contains two native-mode package ranks populated by SDP memory packages 165 configurable in emulation mode as four independently selectable demi-ranks. Accordingly, when the two physical modules $155_0$ and $155_1$ are coupled to respective halves of the host data interface, the physical memory module pair implements four module-distributed logical ranks accessible via a point-to-point data channel. If two additional physical modules are provided (i.e., to appear to the host as a second emulated memory module 125), each of those two additional physical modules may be programmed for emulation-mode operation and coupled in multi-drop to a respective half of the data interface to yield 4 more module-distributed logical ranks per channel and thus 8 module-distributed logical ranks overall. As shown at 171, the RCD rank-select outputs within the physical memory modules include four chip-select signals per module which may be operated as discrete (independent) signals in emulation mode to permit independent selection of four demi-ranks, and as paired sets of signals in native mode to enable selection of two on-module logical ranks (i.e., module-unified memory ranks or native-mode package ranks in this example).

Figure 3:
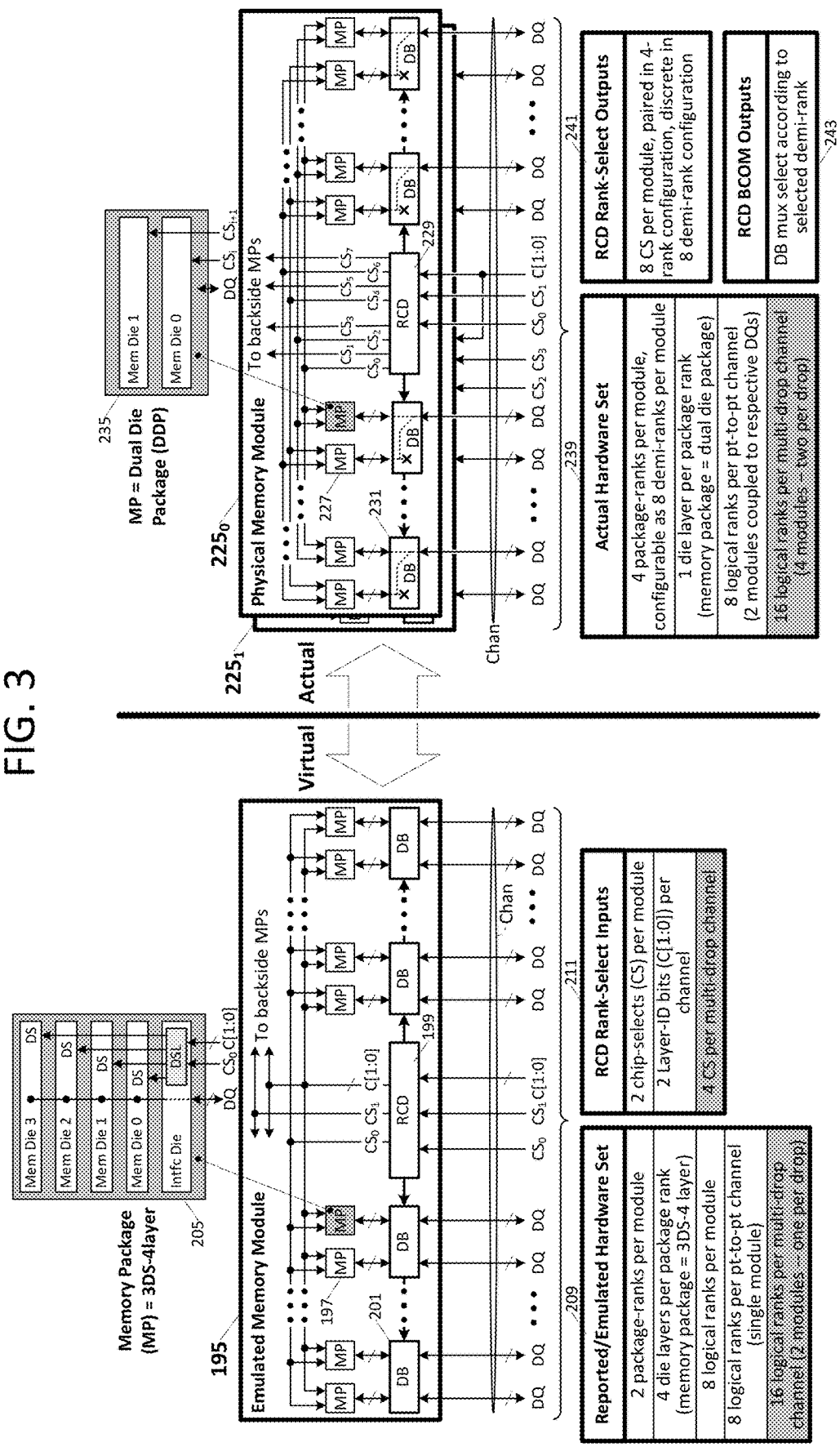
FIG. 3 illustrates another module emulation example with two physical dual-die package (DDP) LRDIMMs emulating an LRDIMM having three-dimensional stacked, 4-layer (3DS-4) memory packages.

FIG. 3 illustrates another module emulation example with two physical dual-die package (DDP) load-reduced DIMMs (LRDIMMs $225_0$ and $225_1$) emulating an LRDIMM 195 having 3DS-4-layer memory packages 197 together with RCD 199 and data buffers 201. That is, from the host perspective, memory packages 197 disposed in each of two emulated package ranks (front-side and backside of emulated LRDIMM 195) are implemented by three-dimensional stacks of four memory dies and an interface die as shown at 205. Accordingly, the host supplies two fully decoded chip-select signals ($CS_0$ and $CS_1$) to select between the front-side and backside package ranks, and also supplies an encoded two-bit chip-ID value, C[1:0], to select one of the four emulated memory dies (e.g., via die-select logic, "DSL," similar to that shown in FIG. 2, but with further decoding to make the one-of-four selection). Referring to table 209, the reported/emulated hardware set includes two package ranks per module and four die layers per package rank. Thus, the host perceives 8 logical ranks per point-to-point channel in a single-module emulation, and sixteen logical ranks per multi-drop channel in a two-module emulation (i.e., four physical modules).

Still referring to the FIG. 3 emulation example, physical memory modules $225_0$ and $225_1$ are dual-die-package (DDP) LRDIMMs (as shown at 235), and thus each populated by half the number of memory dies perceived by the host to be present on the emulated memory module, together with respective RCDs 229 and path-multiplexing data buffers 231. As in FIG. 2, the physical memory modules are coupled to respective halves of the host data interface (DQS not shown), and coupled in parallel to the control signal path, of which only the rank-select signals are shown (i.e., CA, clock, clock-enable, ODT, etc. not shown). In contrast to the emulation-module RCD 199, which, at least conceptually, outputs memory-side chip-select and chip-ID signals that match those supplied by the host (i.e., replicating signals as necessary to meet loading constraints), the actual memory-module RCD components translate (or convert) the host-supplied rank-select signals from the emulated rank-select set to a set of physical demi-rank selection signals—that is, from $CS_0$, $CS_1$ and C[1:0] to eight discrete demi-rank selection signals $CS_0$-$CS_7$ to select a respective one of eight demi-ranks. Each of the physical-module RCDs 229 additionally outputs demi-rank multiplexer control signals to path-multiplexing data buffers 231 (e.g., via the BCOM bus as shown at 243) to couple the constituent memory packages of the selected demi-rank to the operational (used) half of the data buffers' host-side data interfaces (and thus to the half of the module data interface coupled to the host controller). Thus, as shown in table 239, each physical (actual) memory module ($225_0$ or $225_1$) contains four package ranks configurable in emulation mode as eight independently selectable demi-ranks. Accordingly, when the two physical modules $225_0$ and $225_1$ are coupled to respective halves of the host data interface, the physical memory module pair effects eight module-distributed logical ranks accessible via a point-to-point data channel. If two additional physical modules are provided (i.e., to appear to the host as a second emulated memory module 195), each of those two additional physical modules may be programmed for emulation-mode operation and coupled in multi-drop to a respective half of the data interface to yield another 8 module-distributed logical ranks per channel and thus 16 module-distributed logical ranks overall. As shown at 241, the RCD rank-select outputs within the physical memory modules include eight chip-select signals which may be operated as discrete (independent) signals in emulation mode to permit independent selection of eight demi-ranks, and as paired sets of signals in native mode to enable selection of four native-mode logical ranks (i.e., module-unified memory ranks).

Figure 4:
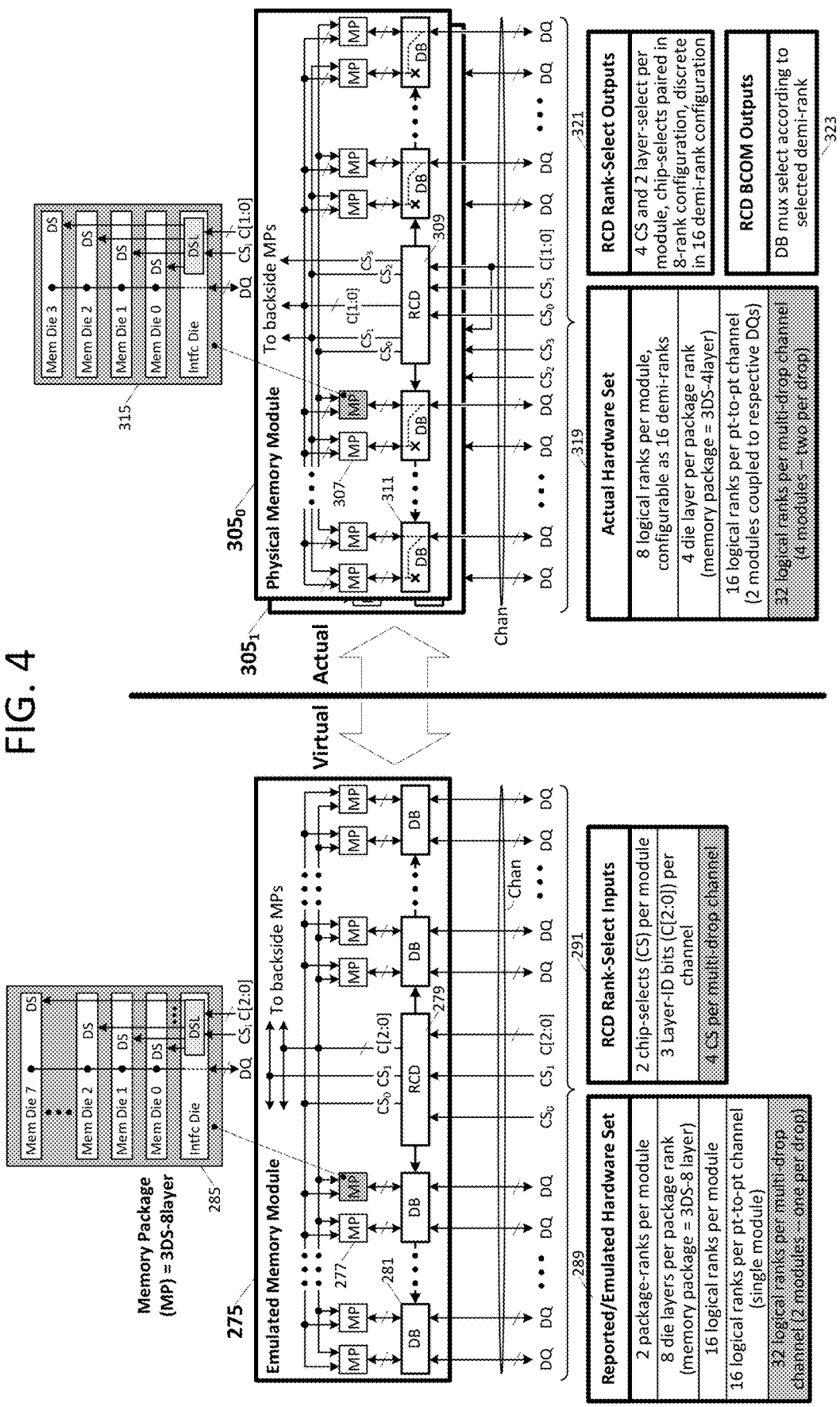
FIG. 4 illustrates a module emulation example in which physical 3DS-4 LRDIMMs emulate an LRDIMM having 3DS-8-layer memory packages.

FIG. 4 illustrates a module emulation example in which physical 3DS-4 LRDIMMs $305_0$ and $305_1$ emulate an LRDIMM 275 having 3DS-8-layer memory packages 277 together with RCD 279 and data buffers 281. From the host perspective, memory packages 277 disposed in each of two emulated package ranks (front-side and backside) of LRDIMM 275) are implemented by three-dimensional stacks of eight memory dies and an interface die as shown at 285. Accordingly, the host supplies two fully decoded chip-select signals ($CS_0$ and $CS_1$) to select between the front-side and backside package ranks, and also supplies an encoded 3-bit chip-ID value, C[2:0], to select one of the eight emulated memory dies (e.g., via die-select logic, "DSL," similar to that shown in FIG. 2, but with further decoding to make the one-of-eight selection). Referring to table 289, the reported/emulated hardware set includes two package ranks per module and eight die layers per package rank. Thus, the host perceives 16 logical ranks per point-to-point channel in a single-module emulation, and 32 logical ranks per multi-drop channel in a two-module emulation (i.e., four physical modules in the multi-drop case).

Still referring to FIG. 4, actual memory modules $305_0$ and $305_1$ are 3DS-4-layer DIMMs (as shown at 315) and thus each populated by half the number of memory dies perceived by the host to be present on emulated memory module 275. As in FIGS. 2 and 3, the physical memory modules are coupled to respective halves of the host data interface and coupled in parallel to the control signal path, of which only the rank-select signals are shown (i.e., command/address, clock, clock-enable, ODT, etc. not shown). In contrast to the emulation-module RCD 279 which, at least conceptually, outputs memory-side chip-select and chip-ID signals that match those supplied by the host (replicating signals as necessary to meet loading constraints), the physical memory-module RCD components 309 translate (or convert) the host-supplied rank-select signals from the emulation rank-select set to a physical demi-rank selection signals—that is, from CS0, $CS_1$ and C[2:0] to four discrete demi-rank selection signals $CS_0$-$CS_3$ and a 2-bit chip-ID (C[1:0]) to select a respective one of sixteen demi-ranks. RCDs 309 additionally output demi-rank multiplexer control signals to data buffers 311 (i.e., via BCOM outputs as shown at 323) to couple the constituent memory packages of the selected demi-rank to the activated half of the data buffers' host-side data interfaces (and thus to the half of the module data interface coupled to the host controller). Thus, as shown in table 319, each physical (actual) memory module contains eight logical ranks configurable in emulation mode as 16 independently selectable demi-ranks. Accordingly, when the two physical modules are coupled to respective halves of the host data interface, the physical memory module pair effects 16 module-distributed logical ranks accessible via a point-to-point data channel. If two additional physical modules are provided (i.e., to appear to the host as a second emulated memory module 275), each of those two additional physical modules may be programmed for emulation-mode operation and coupled in multi-drop to a respective half of the data interface to yield another 16 module-distributed logical ranks per channel and thus 32 module-distributed logical ranks overall. As shown at 321, the RCD rank-select outputs within the physical memory modules include four chip-select signals (operated as discrete signals in emulation mode and as two pairs sets of signals in native mode) and a 2-bit chip-ID to enable selection of the aforementioned 16 demi-ranks (emulation mode) or eight native-mode logical ranks.

FIG. 5 illustrates a non-exhaustive tabulation (350) of emulated memory module types together with perspectives of same by the host (e.g., RCD inputs) and underlying physical implementations (e.g., memory-side RCD outputs). The emulated module types shown in the second, third and final rows of the table correspond to the examples shown in FIGS. 2-4, respectively (i.e., 3DS-2 DIMM emulated by pair of SDP DIMMs, 3DS-4 DIMM emulated by pair of DDP DIMMs, and 3DS-8 DIMM emulated by pair of 3DS-4 DIMMs). Other examples include emulation of a DDP DIMM by a pair of SDP DIMMs (first row of table), emulation of a 3DS-4 DIMM by a pair of 3DS-2 DIMMs (fourth row of table), and emulation of a 3DS-8 SIMM (single inline memory module having a package rank on only one face of the memory module) by a pair of 3DS-4 DIMMs (fifth row of table). Various other emulations are possible (e.g., 3DS-16 DIMM by pair of 3DS-8 DIMMs, etc.).

FIG. 6 illustrates an exemplary production-time-programmable and/or run-time-programmable mode register 363 that may be included within the RCD component of an emulation-mode memory module. In the particular embodiment shown, mode register 363 includes a four-bit emulation control field (ECF[3:0]) in which the most significant bit selects between native-mode operation (ECF[3]=0) and emulation-mode operation (ECF[3]=1). When emulation mode is enabled, the least significant bits (ECF[2:0]) select between various emulation configurations, including the five of the six emulation examples tabulated in FIG. 5 (all except DDP emulation with SDP-populated modules which may also be selectable in an alternative embodiment), as well as a single-stack, four rank (1S4R) emulation by a pair of DDP SIMMs, a single-stack, four rank emulation by a pair of 3DS-2 SIMMS, and a single-stack, two rank (1S2R) emulation by a pair of SDP SIMMs—all shown within exemplary programming table 365. More or fewer emulation options may be programmably selected in alternative embodiments with the emulation control field expanded or contracted accordingly.

FIGS. 7 and 8 illustrate alternative initializations of memory systems that incorporate emulation-mode memory modules. In one embodiment, initialized according to FIG. 7, emulation-mode operation within the underlying memory modules is implemented with complete transparency to the host controller. That is, no (or negligible) changes are required in the host controller or host-control software (e.g., BIOS—basic input/output system software) to initialize or otherwise account for differences between emulation-mode memory modules and a physical instance of the emulated memory module—rather the host perceives each attached pair of memory modules as a single memory module having twice the logical rank count (2× rank) and twice the capacity of either underlying physical memory module. In one implementation, each physical memory module in the emulation pair is pre-configured for emulation-mode operation, for example, through production-time register programming, signal strapping or other programming operation that requires no host action to establish the desired emulation mode within the physical memory modules (although the host BIOS may be modified to support timing calibration/training sequence transmission at system startup). Note that the memory modules may also be designed to operate exclusively in one or more emulation modes and thus lack a native mode option altogether. In embodiments where each of the physical memory modules within the emulation pair includes a serial presence detect (i.e., "SPD"—a non-volatile storage containing host-readable information regarding memory module architecture, capacity and operational characteristics), the SPD on one of the modules may be omitted from the SPD readout path (e.g., not coupled to the system-management bus (SMbus)) and the SPD for at least the SPD-path-coupled memory module may be programmed with information that characterizes the emulated memory module rather than the physical memory module itself. If a motherboard SPD device is present, it too may be populated with information that specifies the emulated module population rather than the physical module population (e.g., one emulated memory module rather than the two physical memory modules). Alternatively, SPDs for physical memory module SPDs may be populated with data that reflects the actual module architecture and each coupled to the SPD readout path, but with the RCDs of those modules being coupled as intermediaries within the SPD readout path and acting to modify SPD returned to the host controller to present the emulated view of the memory module population. In either of these transparent emulation cases, the physical memory modules power up into the emulation mode and, as shown at 381 of FIG. 7, report a virtual (emulated) hardware set to the host controller in response to an SPD query. Thereafter, if the host outputs a command directed to a single logical rank (affirmative determination at 383) within an emulated memory module, the RCDs within the underlying physical module pair convert rank-select signals supplied in association with the command into demi-rank selection signals as discussed above (thus enabling a module-distributed logical rank to respond to the host command) and, in the case of a data read or write operation, also output demi-rank multiplexer control signals to the data buffers to enable the commanded demi-rank to transmit data to or receive data from a corresponding half of the host data interface (385).

Still referring to FIG. 7, if the host outputs a command directed to all logical ranks within the emulated memory module (affirmative determination at 387), the RCDs within each underlying physical memory module drives rank-select outputs and memory-side command/address signals as necessary to broadcast the command and any associated operand(s) to all demi-ranks on the underlying physical memory modules (389).

FIG. 8 illustrates a system initialization that contemplates host awareness of the underlying physical memory modules and optional operation of those modules in either native or emulation modes. Thus, at 395 each physical memory module reports its hardware characteristics and native-mode and emulation-mode options to the host in response to an SPD query, initially powering up in native mode for example. Though not specifically shown, the host may additionally query a motherboard SPD to ascertain the nature of the data path and rank-select signal routing between the host and the memory modules (or sockets into which the memory modules may be removably inserted) and thus whether the system as a whole is wired for emulation-mode operation (split point-to-point data path) or native mode operation (multi-drop data path). Depending on that determination, the host may then program mode registers within the RCDs of the attached memory modules so that, as shown at 397, the RCDs store the native-mode/emulation-mode selection specified by the host. Thereafter, the host may generally operate the attached memory modules in accordance with the programmed operating mode (emulation or native), with the RCDs on the attached modules driving rank-select outputs and data-mux control signals (e.g., demi-rank multiplexer signals) in accordance with the selected operating mode (399).

In a number of embodiments, the RCD may output signals asymmetrically to different groups of memory dies that are otherwise part of the same logical rank (native mode) or same demi-rank (emulation mode). For example, to reduce simultaneous-switching output noise (SSO noise) the RCD may invert and/or re-order the bit significance of predetermined address signals conveyed to memory packages on respective halves ("A" and "B" sides) of the memory module (e.g., predominantly left and predominantly right sides of the module, though the memory packages may be physically interleaved). While this inversion/bit-reordering is of no operational consequence during memory access operations (address mapping will be different for the halves of the module, but nonetheless deterministic), for operations in which the address lines convey information required to be identically delivered to the module halves (e.g., register programming information or the like), the RCD within an emulation memory module detects the access type and outputs rank-select signals accordingly. For example, where mode register information to be programmed within all or selected memory dies is conveyed over the CA bus (e.g., instead of address values), a two-pass command sequence may be used to program the halves of the memory module (or package rank) one at a time—chip-ID signal(s) and/or command bit(s) may be used to indicate which of the A-side/B-side packages are to be programmed. Where mode register information is to be programmed within a specific memory die or memory package (e.g., in a per-DRAM-addressable (PDA) mode), information supplied on the data path may be used in combination with chip-select/chip-ID signals to enable access within the memory die or memory package. Moreover, in contrast to conventional module topologies in which A-side memory packages and B-side memory packages are cloistered on separate physical sides of the memory module, in emulation-capable memory modules the A-side/B-side memory packages may be staggered (alternated), A-B-A-B-A-B- . . . -A-B (i.e., each pair of A-side memory packages sandwiching a B-side memory package, and vice-versa).

Figure 9:
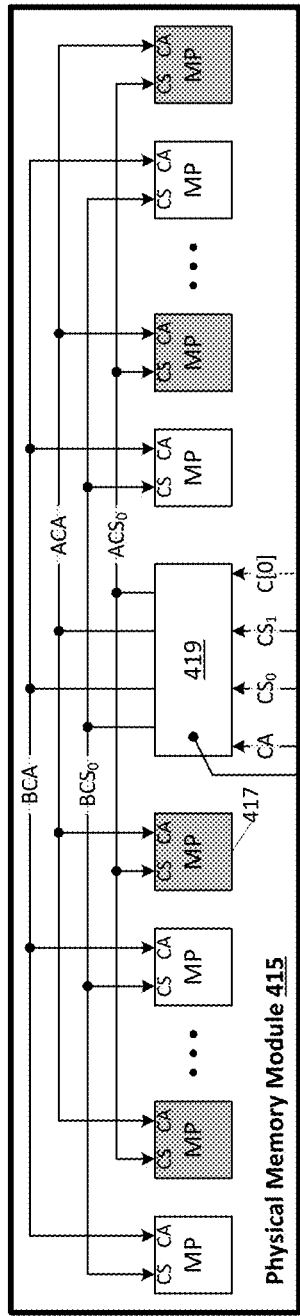
FIG. 9 illustrates an exemplary RCD input to output conversion for various native and emulation mode operations within an LRDIMM populated by single-die memory packages.

FIG. 9 illustrates an exemplary RCD input to output conversion for various native and emulation mode operations within a SDP-populated LRDIMM 415. As shown in table 425, in native mode, RCD 419 asserts A-side chip-select signal for a given native-mode package rank to enable exclusive A-side access (B-side memory-packages not accessed). RCD 419 similarly asserts the B-side chip-select signal for a given native-mode package rank to enable exclusively B-side, native-mode access. Thus, to access the A-side memory packages within the front-side native-mode package rank, $ACS_0$ is asserted, and to access the B-side memory packages within the front-side native-mode package rank $BCS_0$ is asserted. To access the A-side memory packages within the back-side package rank, $ACS_1$ is asserted, and to access the B-side memory packages within the back-side package rank $BCS_1$ is asserted. To access either logical rank in native mode, the A-side and B-side chip-select signals are driven for the desired package ranks (i.e., $ACS_0/BCS_0$ for the front-side logical rank, and $ACS_1/BCS_1$ for the back-side logical rank). Note that one or more chip ID bits and/or one or more bits conveyed in an incoming command (e.g., mode-register programming command) may indicate whether A-side or B-side access is to be carried out.

Still referring to FIG. 9, in emulation mode, halves of a given package rank are accessed exactly as in native mode, but logical half-rank access (i.e., demi-rank access) is effected by asserting only one of the A-side/B-side chip-select signals for a given native-mode package ranks (e.g., $ACS_0$ or $BCS_0$, $ACS_1$ or $BCS_1$). In emulation modules having two or more chip-ID-selected die layers (e.g., physical memory packages are 3DS-2, 3DS-4, 3DS-8, etc.), additional information may be provided to the interface dies of selected memory packages to enable broadcast operation to all memory dies within the package.

FIGS. 10A and 10B illustrate alternative approaches for carrying out emulation-mode operations that apply to an entire device layer of a physical package rank and require time-multiplexed access to/use of a shared resource. In the particular examples shown, the device-layer operations are assumed to be short-sequence or long-sequence driver-strength calibration operations (i.e., incoming command specifies ZQCS (short-sequence driver-strength calibration) or ZQCL (long-sequence driver-strength calibration)) in which a calibration hardware element (e.g., calibration resistor) is shared among the package ranks. In the embodiment of FIG. 10A, each incoming ZQCS/ZQCL command is converted to a pair of commands directed to respective demi-ranks and thus respective halves of the physical package rank. As shown, the module RCD component imposes a delay between the demi-rank ZQCS/ZQCL commands in accordance with a programmed tZQCS delay value (or tZQoper or tZQinit value). The host controller may program the delay value into RCD configuration registers of respective modules during system initialization.

In the embodiment of FIG. 10B, the host controller outputs multiple instances of the ZQCS/ZQCL command to each package rank and the RCD distributes each command instance to a respective demi-rank. In this case, the interval between ZQCS/ZQCL operations in the demi-ranks of a given package rank is established by the host-imposed timing between replicated commands and thus may vary according to instantaneous host traffic levels.

While embodiments disclosed thus far demonstrate emulation of a memory module having 2R ranks with a pair of single-rank (1R) modules, the same capacity doubling may be achieved by emulating a memory module having R-ranks of 2C-capacity memory packages with a pair of R-rank memory modules populated with C-capacity memory packages. In that case, the RCD on each R-rank memory module would create additional chip-selects using an incoming row-address bit (e.g., most significant bit or least significant bit, though any row address bit may be used) such that each module selects between demi-ranks of a native-mode package rank in accordance with that row-address bit. In yet other embodiments, both rank-doubled and capacity-doubled emulation may be effected using four 1R/1C memory modules to emulate a single 2R/2C memory module. Various other combinations are possible (e.g., 4R/1C module emulated by four 1R/1C modules; 1R/4C module emulated by four 1R/1C module, etc.).

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific voltages, pixel array sizes, signal path widths, signaling or operating frequencies, component circuits or devices and the like can be different from those described above in alternative embodiments. Additionally, links or other interconnection between integrated circuit devices or internal circuit elements or blocks may be shown as buses or as single signal lines. Each of the buses can alternatively be a single signal line, and each of the single signal lines can alternatively be buses. Signals and signaling links, however shown or described, can be single-ended or differential. Timing edges, however depicted or described, may have rising-edge and/or falling-edge sensitivity in alternative embodiments (or be level sensitive), and active high or low logic levels may be reversed from those shown. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "light" as used to apply to radiation is not limited to visible light, and when used to describe sensor function is intended to apply to the wavelength band or bands to which a particular pixel construction (including any corresponding filters) is sensitive. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A method of operation within a memory system having a control component, N data signaling links coupled to the control component, and first and second memory modules each having an N-bit data interface in which a first half of N interconnects is coupled to a respective half of the N data signaling links and a second half of the N interconnects is electrically isolated from the control component and the other of the first and second memory modules, the first memory module having a plurality of discrete memory die packages and a command/address buffer component, the method comprising:

receiving a memory access command and chip-select input signals within the command/address buffer component; and outputting chip-select output signals from the command/address buffer component to exclusively enable one of a plurality of groups of the discrete memory die packages to respond to the memory access command, each of the plurality of groups of the discrete memory die packages having a collective data interface width less than the N-bit data interface width, and the chip-select output signals exceeding the chip-select input signals in quantity.

2. The method of claim 1 wherein receiving chip-select input signals comprises receiving M chip-select input signals with only one of the chip-select input signals asserted, and wherein outputting chip-select output signals comprises outputting 2M chip-select output signals with only one of the chip-select output signals asserted.

3. The method of claim 1 wherein the first memory module is a dual inline memory module (DIMM) in which respective halves of the discrete memory die packages are disposed in rows on opposite faces of the DIMM, and wherein receiving the chip-select input signals within the command/address buffer component comprises receiving two chip-select signals.

4. The method of claim 3 wherein each group of the plurality of groups of the discrete memory die packages comprises one of four groups of the discrete memory die packages with two of the four groups being constituted by respective halves of the memory die packages on a first of the opposite faces of the DIMM, and the remaining two of the four groups constituted by respective halves of the memory die packages on a second of the opposite faces of the DIMM.

5. The method of claim 4 wherein outputting chip-select output signals from the command/address buffer component to exclusively enable the one of the plurality of groups of the discrete memory die packages comprises outputting four chip-select output signals with only one of the four chip-select output signals in an asserted state to enable one of the four groups of the discrete memory die packages to respond to the memory access command.

6. The method of claim 1 wherein the first memory module further comprises a plurality of data buffer components each coupled to receive control signals from the command/address buffer component and having a data input/output (I/O) multiplexer to switchably interconnect a selected one of four of the memory die packages to a portion of the N-bit data interface in accordance with the control signals from the command/address buffer component.

7. The method of claim 6 further comprising outputting, from the command/address buffer component, one or more multiplexer control signals to the data buffer components to switchably interconnect memory die packages within the enabled one of the plurality of groups of the discrete memory die packages to respective portions of the N-bit data interface.

8. The method of claim 1 further comprising receiving a chip identifier (ID) input signal in association with the chip-select input signals and the memory access command and wherein outputting the chip-select output signals comprises exclusively asserting:
  a first one of the chip-select output signals if a first one of the chip-select input signals is asserted and the chip ID input signal is in a first logic state;
  a second one of the chip-select output signals if the first one of the chip-select input signals is asserted and the chip ID input signal is in a second logic state;
  a third one of the chip-select output signals if a second one of the chip-select input signals is asserted and the chip ID input signal is in the first logic state; and
  a fourth one of the chip-select output signals if the second one of the chip-select input signals is asserted and the chip ID input signal is in the second logic state.

9. The method of claim 1 wherein each of the memory die packages comprises $2^{(M-1)}$ independently selectable memory dies, where M is an integer greater than or equal to two, the method further comprising:
  receiving an (M)-bit chip identifier (ID) value within the command/address buffer component in association with the chip-select input signals and the memory access command; and
  outputting an (M−1)-bit chip ID value to the plurality of discrete memory packages within at least the one of the plurality of groups exclusively enabled to respond to the memory access command to enable one of the $2^{(M-1)}$ independently selectable memory dies within each of the discrete memory packages of the one of the plurality of groups to respond to the memory access command.

10. The method of claim 9 wherein each of the memory die packages comprises a three-dimensional stacked package containing at least two memory dies.

11. A memory system comprising:
  a control component;
  N data signaling links coupled to the control component;
  first and second memory modules each having an N-bit data interface in which a first half of N interconnects is coupled to a respective half of the N data signaling links and a second half of the N interconnects is electrically isolated from the control component and the other of the first and second memory modules, the first memory module comprising:
    a plurality of discrete memory die packages,
    an N-bit data interface to enable connection of the first memory module to as many as N data signaling links external to the memory module; and
    a command/address buffer component to (i) receive a memory access command and chip-select input signals, and (ii) output chip-select output signals to exclusively enable one of a plurality of groups of the discrete memory die packages to respond to the memory access command, each of the plurality of groups of the discrete memory die packages having a collective data interface width less than the N-bit data interface width, and the chip-select output signals exceeding the chip-select input signals in quantity.

12. The memory system of claim 11 wherein the command/address buffer component receives M chip-select input signals with only one of the chip-select input signals asserted, and outputs 2M chip-select output signals with only one of the chip-select output signals asserted.

13. The memory system of claim 11 wherein the first memory module comprises a dual inline memory module (DIMM) in which respective halves of the discrete memory die packages are disposed in rows on opposite faces of the DIMM, and wherein the command/address buffer component to receive the chip-select input signals within the command/address buffer component comprises two chip-select inputs to receive two chip-select input signals.

14. The memory system of claim 13 wherein each group of the plurality of groups of the discrete memory die packages comprises one of four groups of the discrete memory die packages with two of the four groups being constituted by respective halves of the memory die packages on a first one of the opposite faces of the DIMM, and the remaining two of the four groups constituted by respective halves of the memory die packages on a second one of the opposite faces of the DIMM.

15. The memory system of claim 14 wherein the command/address buffer component to output chip-select output signals to exclusively enable the one of the plurality of groups of the discrete memory die packages comprises circuitry to output four chip-select output signals with only one of the four chip-select output signals in an asserted state to enable one of the four groups of the discrete memory die packages to respond to the memory access command.

16. The memory system of claim 11 wherein the first memory module further comprises a plurality of data buffer components each coupled to receive control signals from the command/address buffer component and having a data input/output (I/O) multiplexer to switchably interconnect a selected one of four of the memory die packages to a portion of the N-bit data interface in accordance with the control signals from the command/address buffer component.

17. The memory system of claim 16 wherein the command/address buffer component comprises circuitry to output one or more multiplexer control signals to the data buffer components to switchably interconnect memory die packages within the enabled one of the plurality of groups of the discrete memory die packages to respective portions of the N-bit data interface.

18. The memory system of claim 11 wherein the command/address buffer component is additionally to receiving a chip identifier (ID) input signal in association with the chip-select input signals and the memory access command and circuitry to output the chip-select output signals by exclusively asserting:
  a first one of the chip-select output signals if a first one of the chip-select input signals is asserted and the chip ID input signal is in a first logic state;
  a second one of the chip-select output signals if the first one of the chip-select input signals is asserted and the chip ID input signal is in a second logic state;
  a third one of the chip-select output signals if a second one of the chip-select input signals is asserted and the chip ID input signal is in the first logic state; and
  a fourth one of the chip-select output signals if the second one of the chip-select input signals is asserted and the chip ID input signal is in the second logic state.

19. The memory system of claim 11 wherein each of the memory die packages comprises $2^{(M-1)}$ independently selectable memory dies, where M is an integer greater than or equal to two, and wherein the command/address buffer is further to:
  receive an (M)-bit chip identifier (ID) value within the command/address buffer component in association with the chip-select input signals and the memory access command; and
  output an (M−1)-bit chip ID value to the plurality of discrete memory packages within at least the one of the plurality of groups exclusively enabled to respond to the memory access command to enable one of the $2^{(M-1)}$ independently selectable memory dies within each of the discrete memory packages of the one of the plurality of groups to respond to the memory access command.

20. The memory system of claim 19 wherein each of the memory die packages comprises a three-dimensional stacked package containing at least two memory dies.

21. A memory system comprising:
a control component;
N data signaling links coupled to the control component;
first and second memory modules each having an N-bit data interface in which a first half of N interconnects is coupled to a respective half of the N data signaling links and a second half of the N interconnects is electrically isolated from the control component and the other of the first and second memory modules, the first memory module comprising:
a plurality of discrete memory die packages,
an N-bit data interface to enable connection of the first memory module to N data signaling links external to the memory module; and
means for receiving a memory access command and chip-select input signals; and
means for outputting chip-select output signals from the command/address buffer component to exclusively enable one of a plurality of groups of the discrete memory die packages to respond to the memory access command, each of the plurality of groups of the discrete memory die packages having a collective data interface width less than the N-bit data interface width, and the chip-select output signals exceeding the chip-select input signals in quantity.

\* \* \* \* \*